(12) United States Patent
Shin et al.

(10) Patent No.: US 9,741,562 B2
(45) Date of Patent: Aug. 22, 2017

(54) METHOD FOR FORMING POLYSILICON FILM

(71) Applicant: EUGENE TECHNOLOGY CO., LTD., Yongin-si, Gyeonggi-do (KR)

(72) Inventors: Seung-Woo Shin, Hwaseong-si (KR); Woo Duck Jung, Suwon-si (KR); Sung-Kil Cho, Yongin-si (KR); Ho Min Choi, Yongin-si (KR); Wan Suk Oh, Yongin-si (KR); Koon Woo Lee, Yongin-si (KR); Hyuk Lyong Gwon, Siheung-si (KR); Seong Jin Park, Seoul (KR); Ki Ho Kim, Asan-si (KR); Kang-Wook Lee, Uijeongbu-si (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/116,974

(22) PCT Filed: Jan. 27, 2015

(86) PCT No.: PCT/KR2015/000853
§ 371 (c)(1),
(2) Date: Aug. 5, 2016

(87) PCT Pub. No.: WO2015/130016
PCT Pub. Date: Sep. 3, 2015

(65) Prior Publication Data
US 2017/0178906 A1 Jun. 22, 2017

(30) Foreign Application Priority Data
Feb. 26, 2014 (KR) .................. 10-2014-0022837

(51) Int. Cl.
*H01L 21/02* (2006.01)

(52) U.S. Cl.
CPC .. *H01L 21/02667* (2013.01); *H01L 21/02532* (2013.01); *H01L 21/02592* (2013.01); *H01L 21/02595* (2013.01); *H01L 21/02658* (2013.01)

(58) Field of Classification Search
CPC ............... H01L 21/02667; H01L 21/02532
See application file for complete search history.

(56) References Cited

U.S. PATENT DOCUMENTS 5,389,570 A * 2/1995 Shiozawa ............. C23C 16/045
257/E21.012
6,410,090 B1 6/2002 Wang
(Continued)

FOREIGN PATENT DOCUMENTS

KR   10-1998-0055759 A   9/1998
KR      10-0217902 B1    9/1999
(Continued)

*Primary Examiner* — Errol Fernandes
(74) *Attorney, Agent, or Firm* — Rabin & Berdo, P.C.

(57) ABSTRACT

Provided is a method for forming a silicon film, and more particularly, to a method for forming a polycrystalline silicon film including pretreatment process in a process for forming a silicon film. According to an embodiment of the present invention, a method for forming a polycrystalline silicon film by annealing a amorphous silicon film deposited on a base, the method includes a pretreatment process of allowing a pretreatment gas including at least one of N, C, O and B to flow.

14 Claims, 13 Drawing Sheets

(56) References Cited

U.S. PATENT DOCUMENTS

| | | | |
|---|---|---|---|
| 6,488,776 B2 | 12/2002 | Wang | |
| 6,607,946 B1 | 8/2003 | Sandhu et al. | |
| 6,861,614 B1* | 3/2005 | Tanabe | B23K 26/04 |
| | | | 219/121.66 |
| 6,864,125 B2 | 3/2005 | Sandhu et al. | |
| 7,235,498 B2 | 6/2007 | Sandhu et al. | |
| 7,354,858 B2 | 4/2008 | Takahashi et al. | |
| 7,618,901 B2 | 11/2009 | Sandhu et al. | |
| 7,837,790 B2 | 11/2010 | Kim et al. | |
| 2002/0162505 A1 | 11/2002 | Wang | |
| 2004/0038462 A1 | 2/2004 | Sandhu et al. | |
| 2005/0153569 A1 | 7/2005 | Sandhu et al. | |
| 2005/0227459 A1 | 10/2005 | Takahashi et al. | |
| 2007/0010103 A1* | 1/2007 | Chua | H01L 21/2822 |
| | | | 438/786 |
| 2007/0207573 A1 | 9/2007 | Sandhu et al. | |
| 2008/0132018 A1 | 6/2008 | Kim et al. | |
| 2011/0263105 A1 | 10/2011 | Hasebe et al. | |

FOREIGN PATENT DOCUMENTS

| | | |
|---|---|---|
| KR | 10-2006-0044968 A | 5/2006 |
| KR | 10-2009-0107382 A | 10/2009 |
| KR | 10-2011-0119581 A | 11/2011 |

\* cited by examiner (a)

(b)

METHOD FOR FORMING POLYSILICON FILM

TECHNICAL FIELD

The present invention disclosed herein relates to a method for forming a polycrystalline silicon film, and more particularly, to a method for forming a polycrystalline silicon film including a pretreatment process.

BACKGROUND ART

In one of the methods for forming a polycrystalline silicon film, in order to form a film including an amorphous silicon film on a base, first, a silane-based gas may be supplied to a surface of a heated base (or a silicon dioxide film), and then pyrolyzed to form the amorphous silicon film on the surface of the base.

After that, a polycrystalline silicone film is formed through annealing. However, silicon migration takes place in annealing to cause agglomeration of silicon. In this process, a thickness of the surface is not uniform to increase roughness.

DISCLOSURE

Technical Problem

The present invention provides a method for forming a polycrystalline silicon film, the method capable of preventing silicon migration that occurs in annealing of a amorphous silicon film.

The present invention also provides a method for forming a polycrystalline silicon film, the method capable of improving the accuracy of surface roughness of a silicon film.

Other objects of the present invention will be clarified through following detailed descriptions and drawings.

Technical Solution

Embodiments of the present invention provide methods for forming a polycrystalline silicon film by annealing an amorphous silicon film deposited on a base, the method including a pretreatment process of bonding any one of nitrogen (N), carbon (C), oxygen (O), and boron (B) to a silicon atom included in the amorphous silicon film by supplying a pretreatment gas including at least one of N, C, O and B to pyrolyze the pretreatment gas before the annealing.

In some embodiments, the pretreatment gas may be at least one of $N_2O$, $C_2H_4$, $NH_3$ and $B_2H_6$.

In other embodiments, the pretreatment gas may be supplied at a rate of about 4,000 sccm to about 6,000 sccm for about 50 seconds to about 70 seconds.

In still other embodiments, the pretreatment may be performed in a temperature range of about 500° C. to about 750° C. and in a pressure range of about 20 torr to about 300 torr.

In even other embodiments, the amorphous silicon film may have a thickness of about 100 Å or less.

In yet other embodiments, the annealing may be performed in a temperature range of about 800° C. to about 950° C. for about 10 seconds to about 100 seconds.

In further embodiments, the annealing may be performed in a pressure range of about 1 torr to about 10 torr.

In still further embodiments, the methods may be used in a process of forming a film for a semiconductor device.

Advantageous Effects

According to an embodiment of the present invention, a pretreatment process is performed prior to annealing an amorphous silicon film, so that silicon migration, which occurs in annealing, may be prevented. Also, when a polycrystalline silicon film is formed through annealing, surface roughness of the polycrystalline silicon film may be improved.

BEST MODE

Figure 1:
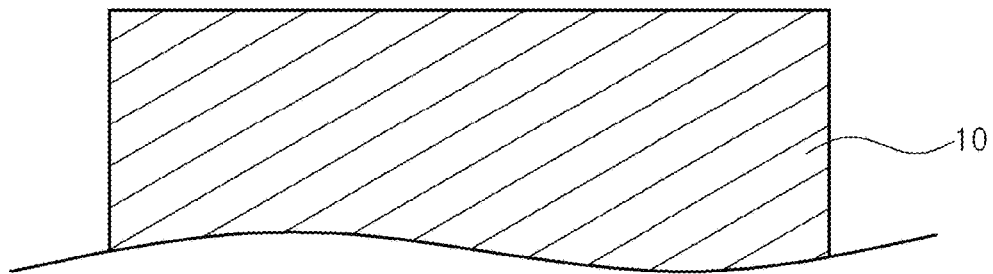
FIG. 1 is a view illustrating a base layer.

Preferred embodiments of the present invention will be described below in more detail with reference to the accompanying drawings. The present invention may, however, be embodied in different forms and should not be constructed as limited to the embodiments set forth herein.

Rather, these embodiments are provided so that this disclosure will be thorough and complete, and will fully convey the scope of the present invention to those skilled in the art. In the drawings, the shapes of each of elements are exaggerated for clarity of illustration. Meanwhile, it is obvious to the skilled person in the art that embodiments of the present invention can be applicable to silicon films in various states besides a semiconductor manufacturing process as will be described in embodiments.

In a semiconductor manufacturing process, an amorphous silicon film is formed, and then is annealed to form a polycrystalline silicon film through crystallization.

Figure 2:
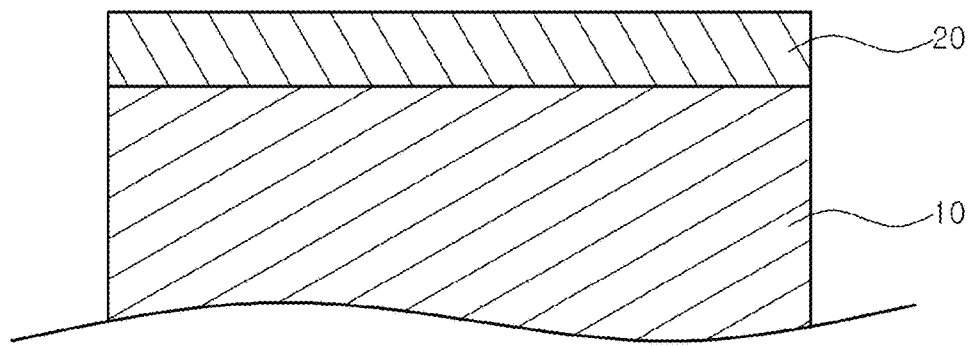
FIG. 2 is a view illustrating that a polycrystalline silicon film is formed on a base layer.
Figure 3:
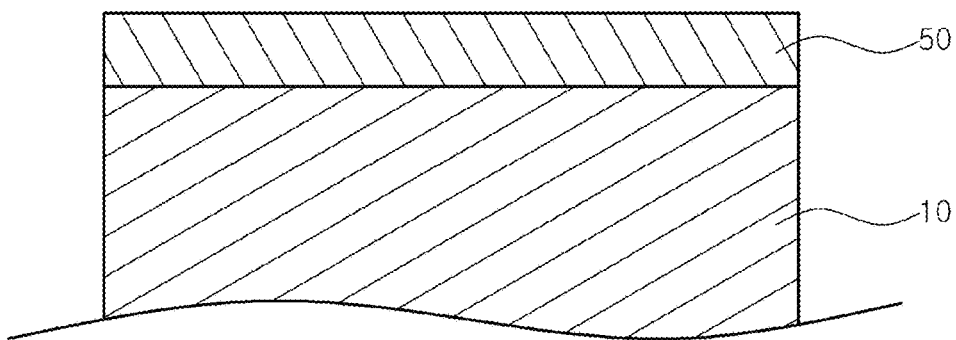
FIG. 3 is a view illustrating that a polycrystalline silicon film is formed.

FIGS. 1 to 3 are views illustrating processes for forming a silicon film. First, as illustrated in FIG. 1, a base 10 may be formed of a silicon dioxide film, a silicon nitride film or the like. As illustrated in FIG. 2, an amorphous silicon film 20 is formed on the base 10. The amorphous silicon film 20 may be formed in a pressure range of about 20 torr to about 200 torr, and a silicon precursor gas, such as a silane-based gas or an aminosilane-based gas may be supplied at a flow rate of about 10 sccm to about 200 sccm When the amorphous silicon film 20 is annealed, a polycrystalline silicon film 50 is formed as illustrated in FIG. 3. The annealing may be performed in a temperature range of about 800° C. to about 950° C. for about 10 seconds to about 100 seconds, and preferably, at a temperature of about 900° C. for about 30 seconds. Also, a chamber in which the annealing is performed may have a process pressure of 1 torr to 10 torr.

Figure 4:
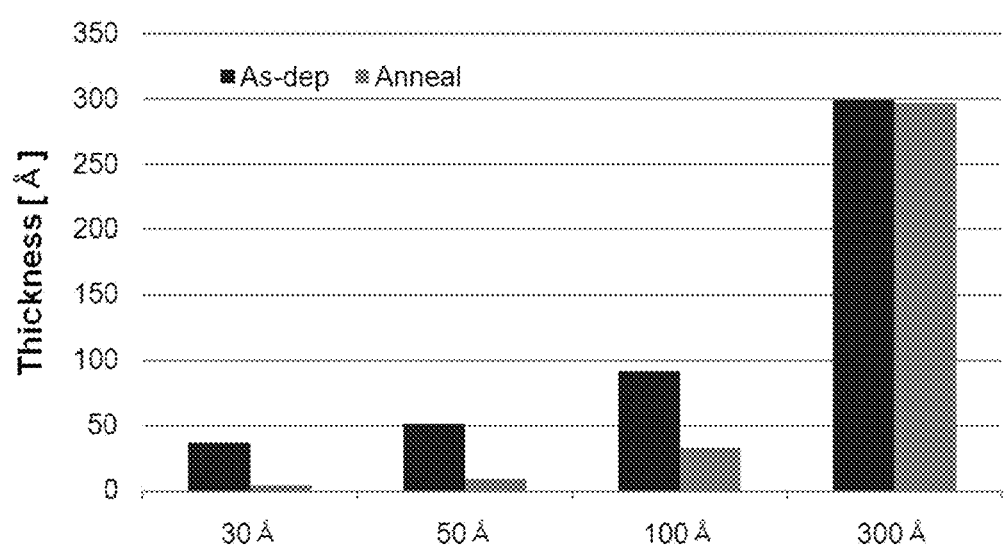
FIG. 4 is a graph showing a thickness of a silicon film according to a thickness of an amorphous silicon film before and after annealing.

FIG. 4 is a graph showing a thickness of a silicon film according to a thickness of a amorphous silicon film before annealing (As-dep) and after annealing (Anneal) in the processes described above. When it is examined that thicknesses of the silicon films are about 30 Å, about 50 Å, and about 100 Å, respectively, it may be confirmed that after annealing, the thickness of the silicon film is reduced.

It is determined that this result is due to a fact that in a case of a thin film, silicon atoms are moved in annealing and nonuniformly distributed. When annealing is performed, in a case of amorphous silicon, silicon migration occurs. When the silicon migration occurs, silicon atoms on a surface are agglomerated, and accordingly, the surface is not uniform to reduce a thickness. It is determined that the silicon migration occurs due to a bonding between silicon atoms in the amorphous silicon film 20 and silicon atoms therearound, and it seems that silicon atoms are bonded to each other by using energy supplied through annealing.

In order to prevent the silicon migration, after the amorphous silicon film is formed, a pretreatment process may be performed prior to annealing. The pretreatment process may be performed by allowing a pretreatment gas including at least one of nitrogen (N), carbon (C), oxygen (O), and boron (B) to flow prior to annealing. Preferably, the pretreatment process may be performed by allowing at least one pretreatment gas of nitrous oxide ($N_2O$), ethylene ($C_2H_4$), ammonia ($NH_3$), and diborane ($B_2H_6$) to flow on a silicon film.

It may be preferable to allow the pretreatment gas to flow at a rate of 5,000 sccm for 60 seconds. The "sccm (standard cubic centimeter per minute)" means a flow rate indicated by cc ($cm^3$) per minute in a standard condition. When a concentration of the pretreatment gas is very low, a bonding between silicon atoms of the amorphous silicon film and atoms of the pretreatment gas may not occur. Also, when a flow time of the pretreatment gas is short, the pretreatment gas does not fully cover the amorphous silicon film, so that the bonding between silicon atoms of the amorphous silicon film and atoms of the pretreatment gas may nonuniformly occur. Therefore, the pretreatment gas process may be performed by allowing the pretreatment gas to flow at a rate of about 4,000 sccm to about 5,000 sccm for about 50 seconds to about 70 seconds, and preferably, at a rate of about 5,000 sccm for about 60 seconds.

Also, in order to efficiently bond silicon atoms of the amorphous silicon film and atoms of the pretreatment gas, the pretreatment process may be performed in a temperature range of about 500° C. to about 700° C. and in a pressure range of about 20 torr to about 300 torr, and preferably, at a temperature of about 500° C. and at a pressure of about 100 torr.

When the pretreatment process is performed, the pretreatment gas is pyrolyzed, and thus atoms of one of N, C, O and B of the pretreatment gas and silicon atoms are bonded. Therefore, when annealing is performed after bonding, silicon migration due to a bonding between silicon atoms, may be prevented, and when the silicon migration is prevented, a surface may be uniformly distributed to improve surface roughness.

Figure 5:
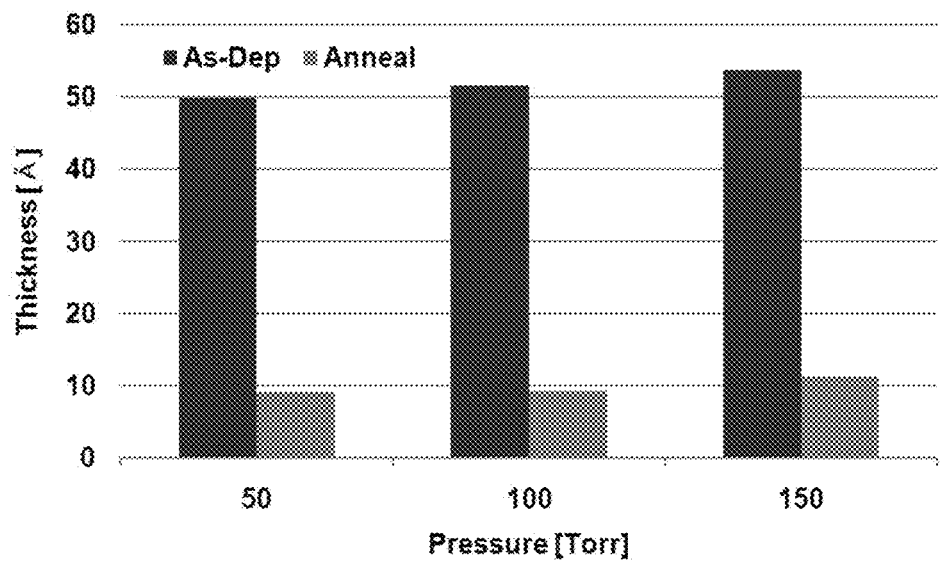
FIG. 5 shows graphs showing a thickness variation of a silicon film according to pressure and time before and after conventional annealing.
Figure 5:
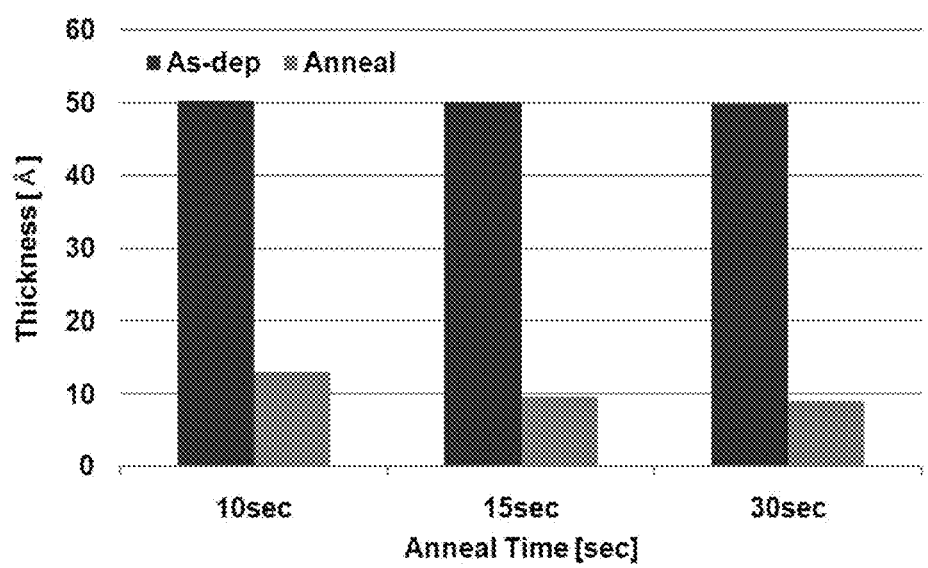
Figure 6:
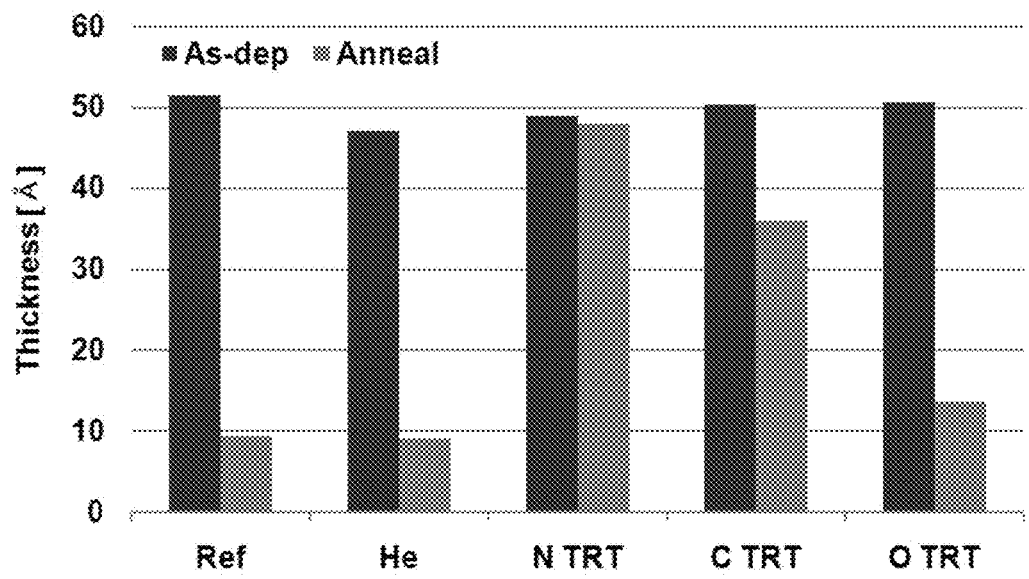
FIG. 6 is a comparison graph showing a thickness variation of a surface before annealing (i.e., As-dep) and after annealing (i.e., Anneal) when a pretreatment process is changed according to an embodiment of the present invention.

FIG. 5 shows graphs showing a thickness variation of a silicon film according to pressure (a) and time (b) before and after conventional annealing. As shown in FIG. 5, when a pretreatment is not performed and annealing is performed, it may be confirmed that there is a delicate difference according to pressure and time but the thickness is decreased to 5 times or more FIG. 6 is a comparison graph showing a thickness variation of a surface before annealing (As-Dep) and after annealing (Anneal) when a pretreatment process is changed. FIG. 6 shows a thickness variation of a silicon film in a case (Ref) that a pretreatment is not performed, in a case (He) that a pretreatment is performed with helium (He), in a case (N TRT) that a pretreatment is performed with ammonia ($NH_3$), in a case (C TRT) that a pretreatment is performed with ethylene ($C_2H_4$), and in a case (O TRT) that a pretreatment is performed with nitrous oxide ($N_2O$) when annealing in each of the cases is performed at a pressure of about 100 torr for about 30 seconds As shown FIG. 6, in the case (Ref) that the pretreatment is not performed, it may be seen that the thickness is reduced from about 50 Å to about 10 Å or less. This phenomenon seems to occur because silicon atoms are agglomerated on a specific portion due to silicon migration to reduce the thickness of the specific portion. The phenomenon also occurs when helium (He) is used as a pretreatment gas. When the pretreatment is performed with an inert gas, helium, since reactivity of helium is low and thus helium scarcely reacts with the amorphous silicon film, it may seem that the similar phenomenon as the case that pretreatment is not performed, occurs.

On the contrary, when the pretreatment is performed with ammonia, it may be seen that there is little change in the film thickness even after annealing. This is considered because an ammonia gas is combined to the amorphous silicon film to obstruct a bonding between silicon atoms to prevent silicon migration. This is similar to the case that the pretreatment is performed with ethylene and the case that the pretreatment is performed with nitrous oxide. The thickness in the case that the pretreatment is performed with ethylene is reduced from about 50 Å before annealing to about 35 Å after annealing, and accordingly, the thickness reduction is lower than that in the case that the pretreatment is not performed. Also, when the pretreatment is performed with nitrous oxide, it may be seen that the thickness is maintained at about 10 Å or more after annealing.

Figure 7:
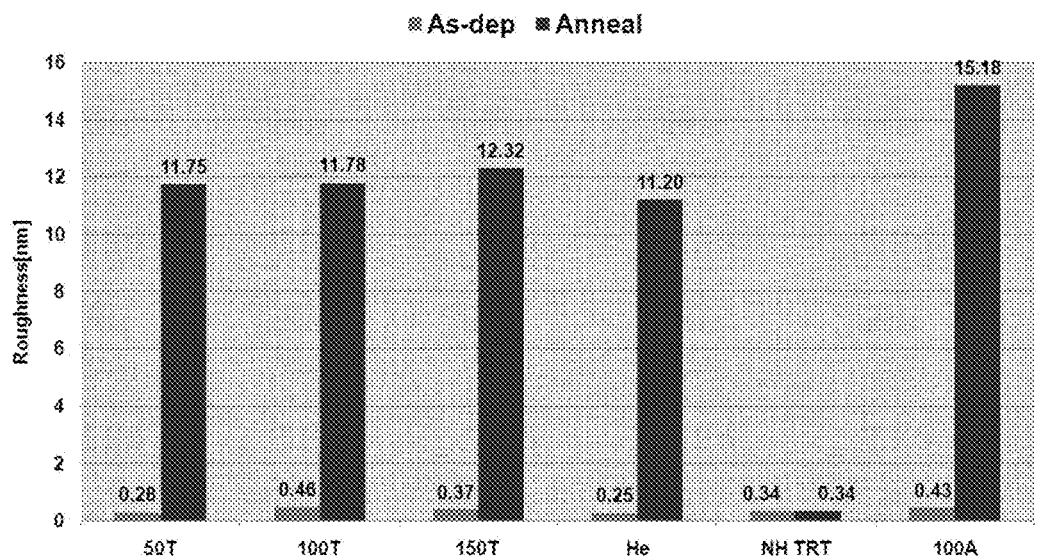
FIG. 7 is a graph showing surface roughness variation after annealing in the case that a pre-treatment is not performed and pressure is changed; and in the case that the pretreatment is performed and the thickness is changed according to an embodiment of the present invention.

FIG. 7 is a graph showing variations in the surface roughness after annealing in the case that the thickness of the amorphous silicon film is about 50 Å, the pretreatment is not performed, and the pressure is changed; in the case that the thickness of the amorphous silicon film is about 50 Å, the pressure is about 100 torr, and the pretreatment is performed with ammonia; and in the case that the pressure is about 100 torr and the thickness of the amorphous silicon film is about 100 Å.

As shown FIG. 7, at the pressure of about 50 torr (50 T), that is, in the case that the pretreatment is not performed, it may be seen that the roughness is increased by about 41.98 times from about 0.28 to about 11.75. Likewise, in the case that the pressure is about 100 torr (100 T) and the case that the pressure is about 150 torr (150 T), it may be seen that the roughness in the respective cases is increased by about 25.60 times and about 33.30 times compared to before annealing. It is considered that such a phenomenon occurs as a result that silicon atoms are agglomerated on a surface due to silicon migration, and accordingly, the surface is not uniform. Similarly, when the pretreatment is performed with an inert gas, helium (He), it may be seen that the amorphous silicon and the pretreatment gas, helium, are not combined, and an effect on preventing silicon migration generated in annealing is little, so roughness is considerably increased.

On the contrary, in the case (NH TRT) that the pretreatment is performed with ammonia, it may be seen that surface roughness before and after annealing is the same and 0.34. As shown above, this is considered because silicon atoms of the amorphous silicon film and nitrogen atoms of ammonia that is the pretreatment gas are bonded to prevent a bonding between silicon atoms, thus preventing a roughening phenomenon due to silicon migration.

Figure 8:
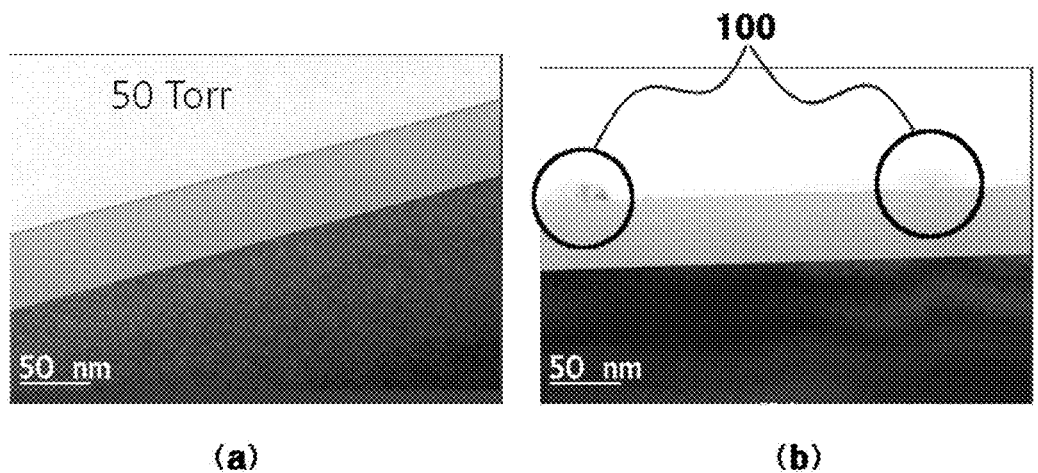
FIG. 8 shows TEM images before (a) and after (b) annealing at a pressure of about 50 torr when a pretreatment is not performed.
Figure 9:
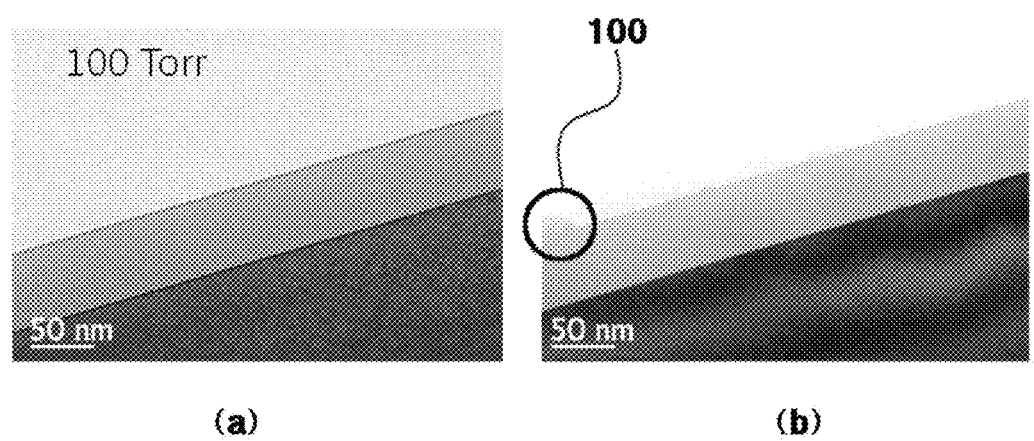
FIG. 9 shows TEM images before (a) and after (b) annealing at a pressure of about 100 torr when pretreatment is not performed.
Figure 10:
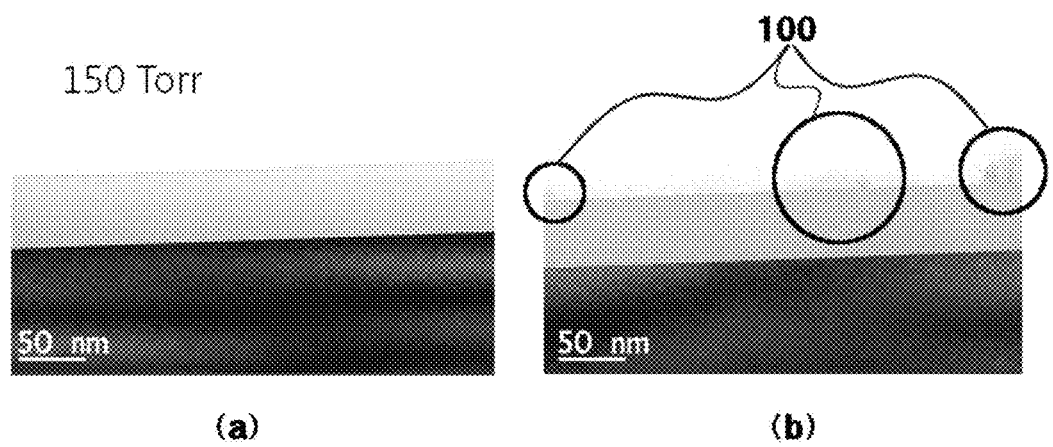
FIG. 10 shows TEM images before (a) and after (b) annealing at a pressure of about 150 torr when a pretreatment is not performed.

FIG. 8 shows TEM images before (a) and after (b) annealing at a pressure of 50 torr when a pretreatment is not performed, FIG. 9 shows TEM images before (a) and after (b) annealing at a pressure of about 100 torr when a pretreatment is not performed, and FIG. 10 shows TEM images before (a) and after (b) annealing at a pressure of about 150 torr when a pretreatment is not performed. From FIGS. 8 to 10, it may be seen that when a pretreatment is not performed, a nonuniform phenomenon 100 largely occurs in all cases after annealing.

Figure 11:
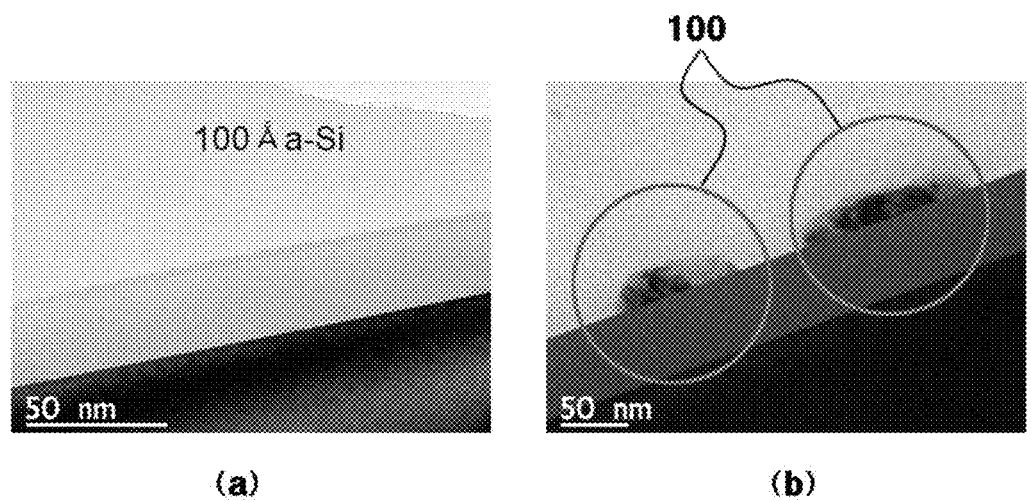
FIG. 11 shows TEM images of an amorphous silicon film having a thickness of about 100 Å before (a) and after (b) annealing when a pretreatment is not performed.
Figure 12:
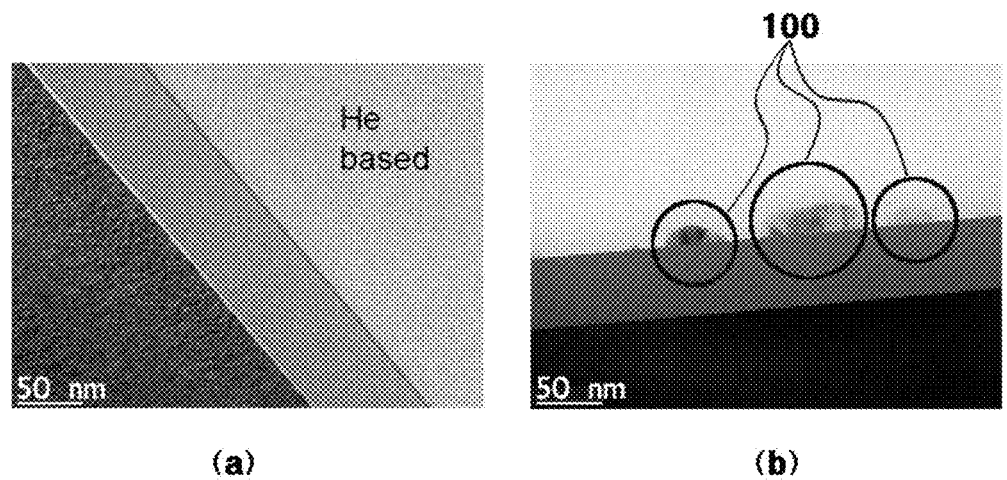
FIG. 12 shows TEM images before (a) and after (b) annealing at a pressure of about 100 torr when a pretreatment is performed with helium (He)
Figure 13:
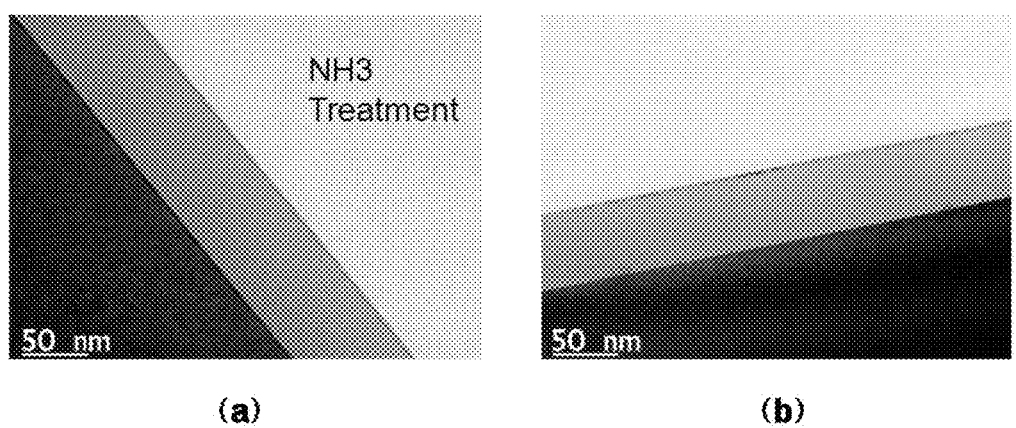
FIG. 13 shows TEM images before (a) and after (b) annealing at a pressure of about 100 torr when a pretreatment is performed with ammonia ($NH_3$) according to an embodiment of the present invention.
Figure 14:
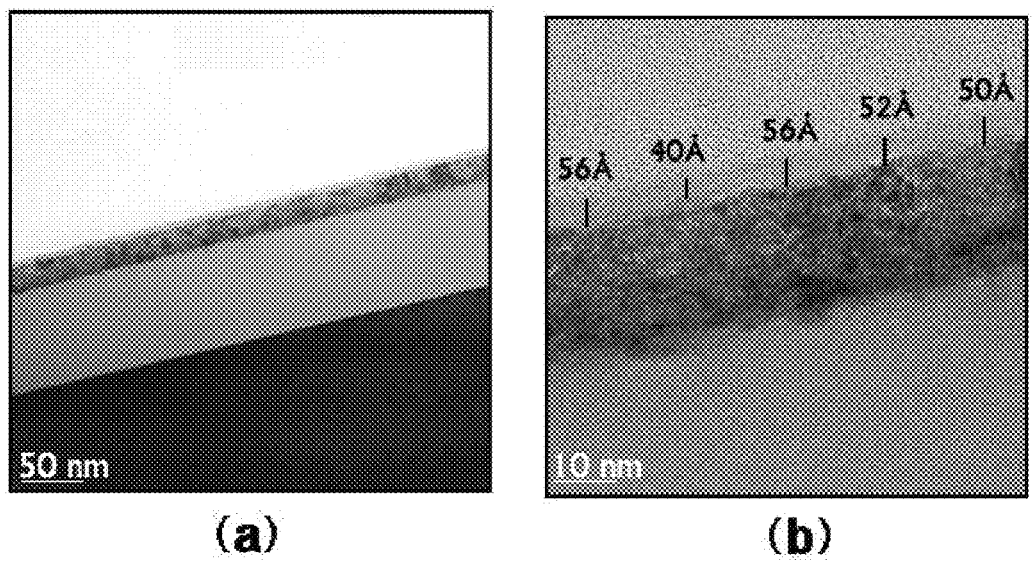
FIG. 14 shows TEM images of Comparative Example 1 in Table 1.
Figure 15:
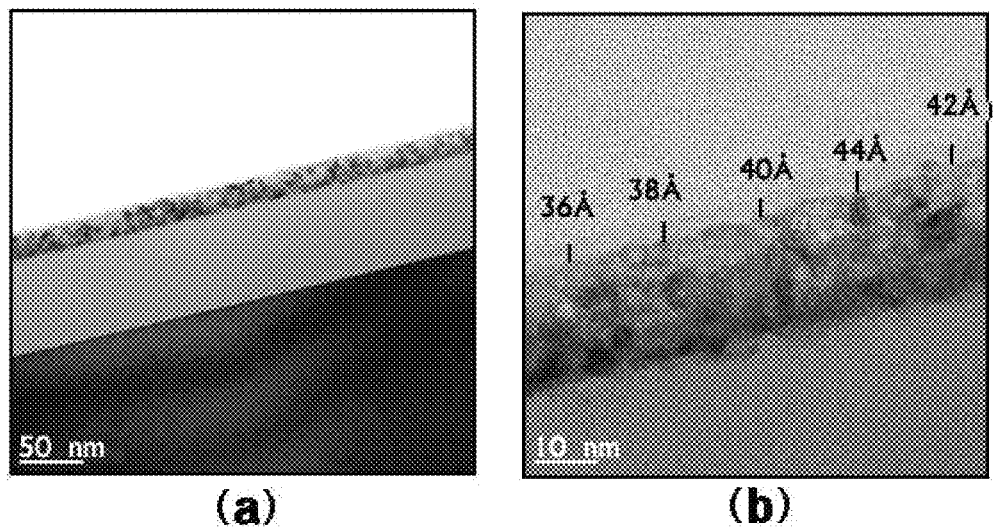
FIG. 15 shows TEM images of Example 1 in Table 1.
Figure 16:
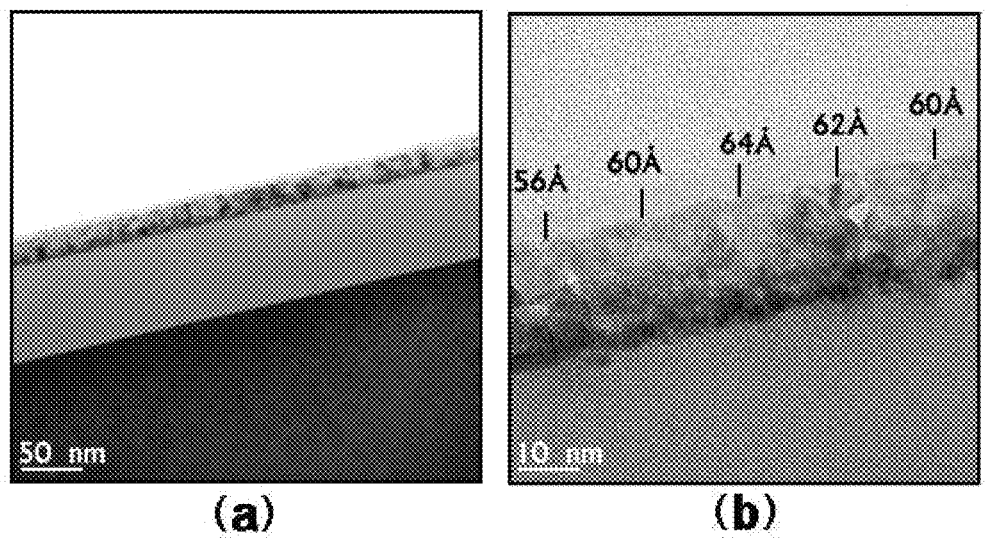
FIG. 16 shows TEM images of Example 2 in Table 1.
Figure 17:
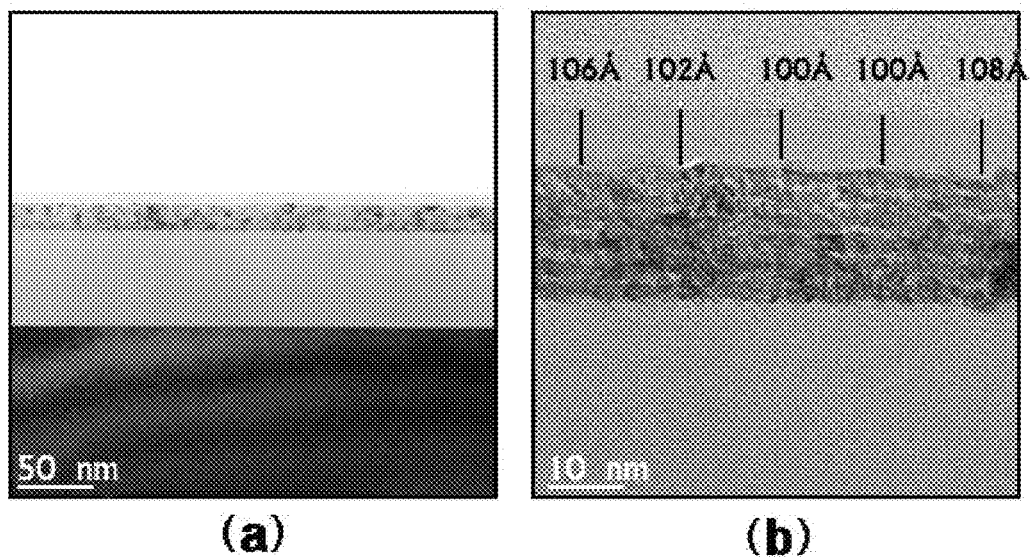
FIG. 17 shows TEM images of Comparative Example 2 in Table 1.
Figure 18:
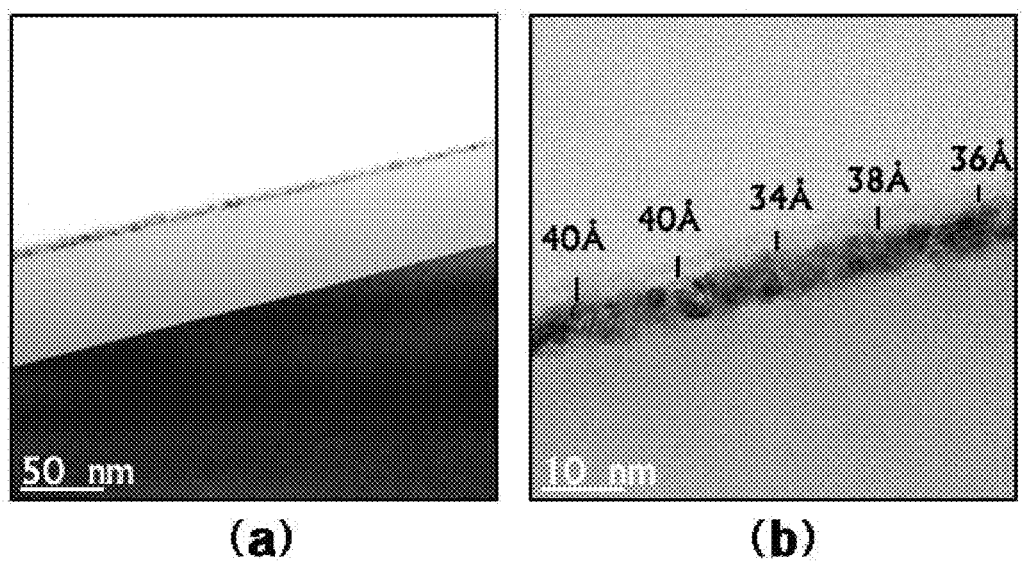
FIG. 18 shows TEM images of Example 3 in Table 1.

FIG. 11 shows TEM images of a amorphous silicon film having a thickness of about 100 Å before (a) and after (b) annealing when a pretreatment is not performed, FIG. 12 shows TEM images before (a) and after (b) annealing when a pretreatment is performed with helium (He), and FIG. 13 shows TEM images before (a) and after (b) annealing when a pretreatment is performed with ammonia ($NH_3$).

In FIG. 11, it may be seen that since a pretreatment is not performed, and the thickness is relatively thin (about 100 Å), a nonuniform phenomenon 100 largely and plentifully occurs after annealing (b). This is considered because when the thickness is thin, silicon migration easily occurs in annealing.

In FIG. 12, as shown above, it may seem that since a bonding between helium atoms and silicon atoms of the amorphous silicon film is difficult when an inert gas, helium, is used as a pretreatment gas, the pretreatment is not efficient. Accordingly, it may seem that since a bonding between silicon atoms is not prevented, and thus silicon migration occurs, a nonuniform phenomenon 100 occurs.

In FIG. 13, it may be confirmed that when the pretreatment is performed with ammonia, nitrogen atoms of the pretreatment gas, ammonia and silicon atoms are bonded to prevent silicon migration during annealing, so a defect of a surface does not occur.

TABLE 1

| Label | TiN Thickness [Å] | DI Rinse | Target [Å] | $NH_3$ Treat. 5000 sccm/ 60 sec | Anneal Condit. 900° C./ 30 sec | Analysis | | |
|---|---|---|---|---|---|---|---|---|
| | | | | | | AFM | TEM | Point |
| Comparative Example 1 | 300 | ∨ | 50 | skip | skip | | ● | C |
| Example 1 | 300 | ∨ | 30 | ∨ | ∨ | | ● | C |
| Example 2 | 300 | ∨ | 50 | ∨ | ∨ | | ● | C |
| Comparative Example 2 | 300 | ∨ | 100 | skip | skip | | ● | C |
| Example 3 | 100 | ∨ | 30 | ∨ | ∨ | | ● | C |
| Comparative Example 3 | 300 | ∨ | 50 | skip | ∨ | | ● | C |
| Comparative Example 4 | 300 | ∨ | 50 | skip | ∨ | | ● | B |

FIGS. 14 to 20 show TEM images of Comparative Example 1 in Table 1, of Example 1 in Table 1, of Example 2 in Table 1, of Comparative Example 2 in Table 1, of Example 3 in Table 1, of Comparative Example 3 in Table 1, and of Comparative Example 4 in Table 1, respectively.

As shown in FIGS. 14 to 18, it may be seen from the results of Comparative Examples 1 and 2, and Examples 1 to 3 that silicon agglomeration is little seen in TEM images.

In Comparative Examples 1 and 2, annealing is omitted, so that silicon agglomeration scarcely occurs. As shown in FIGS. 14 to 17, it may be seen that the thickness of a silicon film is nearly constant.

Figure 19:
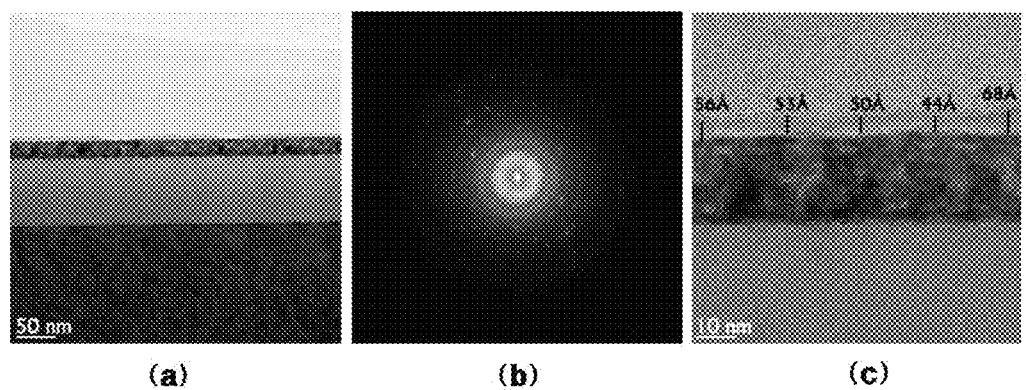
FIG. 19 shows TEM images of Comparative Example 3 in Table 1.
Figure 20:
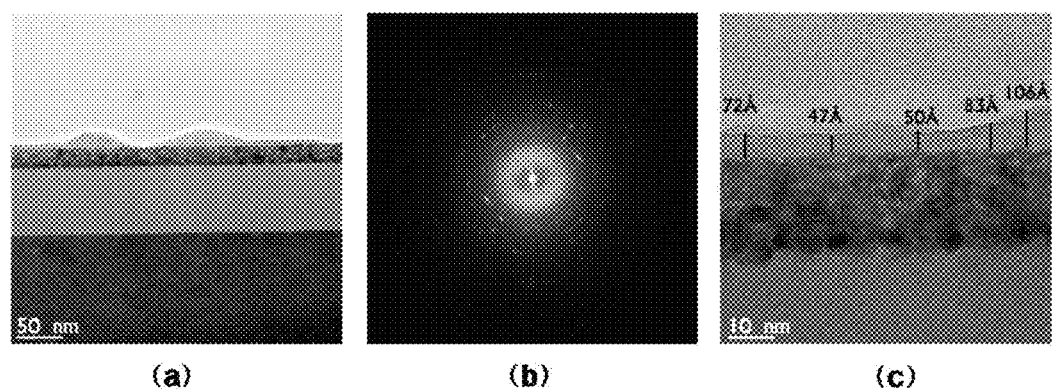
FIG. 20 shows TEM images of Comparative Example 4 in Table 1.

As shown in FIGS. 19 to 20, it may be seen from TEM images in Comparative Examples 3 and 4 that the thickness is nonuniform, so silicon agglomeration occurs. It may be confirmed that in comparison with Example 2, silicon agglomeration occurs because the pretreatment with ammonia ($NH_3$) is omitted.

Figure 21:
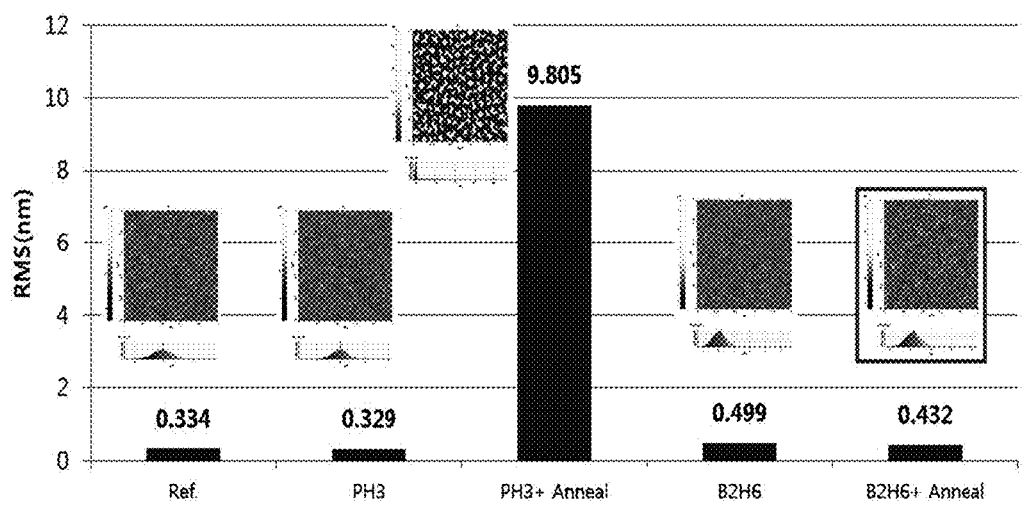
FIG. 21 is a graph showing surface roughness (RMS) according to each treatment.

FIG. 21 is a graph showing surface roughness (RMS) according to each treatment; FIG. 21 shows AFM roughness-analyzed results in the case (Ref) that pretreatment and annealing are not performed, the case (PH3) that annealing is not performed after pretreatment is performed with phosphine ($PH_3$), the case (PH3+Anneal) that annealing is performed after a pretreatment is performed with phosphine ($PH_3$), the case (B2H6) that annealing is not performed after a pretreatment is performed with diborane ($B_2H_6$), and the case (B2H6+Anneal) that annealing is performed after a pretreatment is performed with diborane ($B_2H_6$). Each silicon surface roughness was evaluated depending on existence or nonexistence of annealing for each silicon deposition condition under a layer thermal oxide 1000 Å condition.

As shown in FIG. 21, it may be confirmed that each roughness is nearly identical in the cases that annealing is not performed. However, when annealing is performed and the pretreatment is performed with stable phosphine, it may be seen that roughness is increased by about 30 times from about 0.329 to about 9.805. On the contrary, when the pretreatment is performed with diborane, it may be confirmed that roughness is not increased even after annealing is performed. This may be because when the pretreatment is performed with diborane, silicon atoms of the amorphous silicon film and boron atoms of diborane are bonded to prevent silicon migration in annealing. When silicone atoms and boron atoms of diborane are bonded, a bonding between silicon atoms is prevented to prevent silicon agglomeration.

Figure 22:
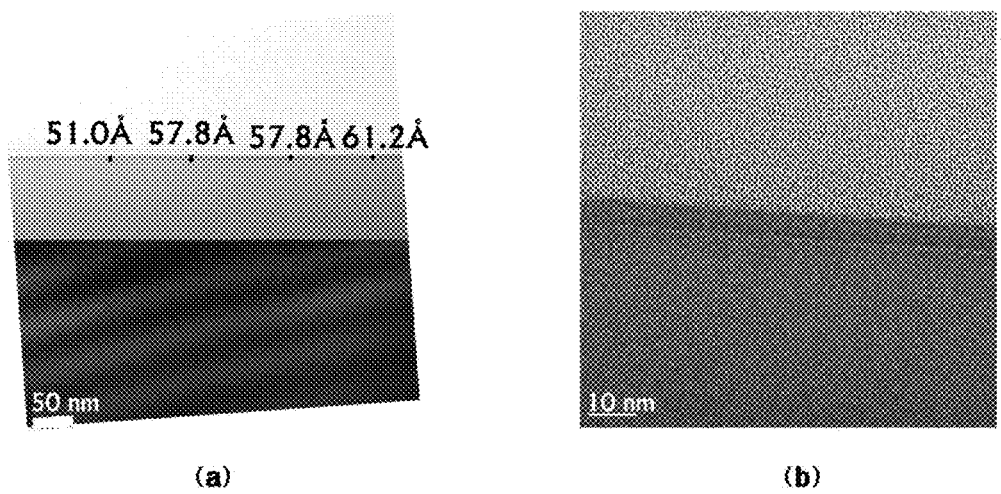
FIG. 22 shows TEM images of a silicon film pretreated with diborane ($B_2H_6$) before annealing according to an embodiment of the present invention.
Figure 23:
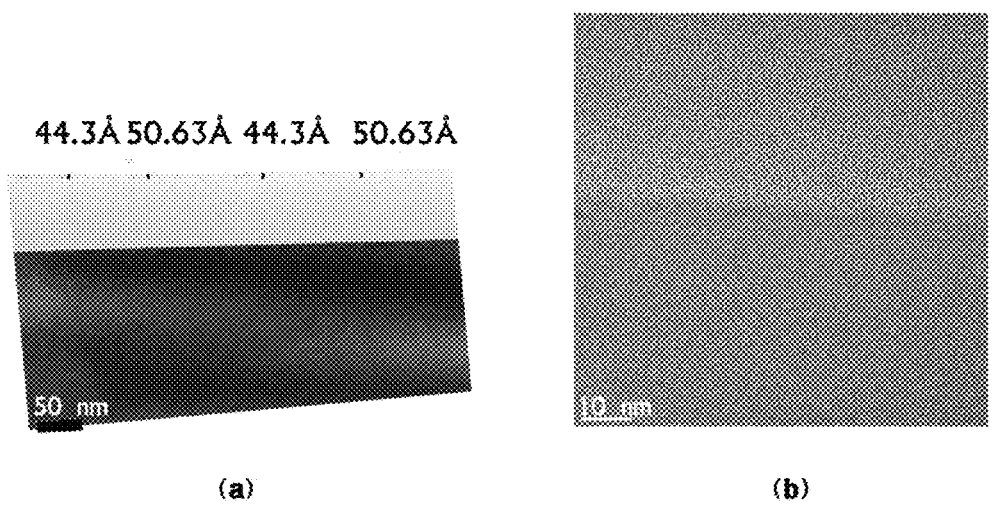
FIG. 23 shows TEM images of a silicon film pretreated with diborane ($B_2H_6$) after annealing according to an embodiment of the present invention.

FIG. 22 shows TEM images of a silicon film pretreated with diborane ($B_2H_6$) before annealing, and FIG. 23 shows TEM images of a silicon film pretreated with diborane ($B_2H_6$) after annealing. In comparison between FIGS. 22 to 23, it may be seen that when the pretreatment is performed with diborane, although annealing is performed, the thickness is nearly constant, so that silicon agglomeration does not occur.

Further, while the present invention has been particularly shown and described with reference to exemplary Examples thereof, various changes in form and details may be made therein without departing from the scope of the present invention described in Claims. Therefore, it should be construed that detailed descriptions and accompanying drawings are exemplified, and do not limit the scope of the present invention.

INDUSTRIAL APPLICABILITY

The present invention may be applicable to a various apparatus for manufacturing semiconductor or a various method for manufacturing semiconductor.

What is claimed is:

1. A method for forming a polycrystalline silicon film by annealing an amorphous silicon film deposited on a base, the method comprising a pretreatment process of bonding any one of nitrogen (N), carbon (C), oxygen (O), and boron (B) to a silicon atom included in the amorphous silicon film by supplying a pretreatment gas including at least one of N, C, O and B to pyrolyze the pretreatment gas before the annealing.

2. The method of claim 1, wherein the pretreatment gas is at least one of $N_2O$, $C_2H_4$, $NH_3$, and $B_2H_6$.

3. The method of claim 1, wherein the pretreatment gas is supplied at a flow rate of about 4,000 sccm to about 6,000 sccm for about 50 seconds to about 70 seconds.

4. The method of claim 1, wherein the pretreatment is performed in a temperature range of about 500° C. to about 750° C. and in a pressure range of about 20 torr to about 300 torr.

5. The method of claim 1, wherein the amorphous silicon film has a thickness of about 100 Å or less.

6. The method of claim 1, wherein the annealing is performed in a temperature range of about 800° C. to about 950° C. for about 10 seconds to about 100 seconds.

7. The method of claim 1, wherein the annealing is performed in a pressure range of about 1 torr to about 10 torr.

8. The method of claim 1, being used in a process of forming a film for a semiconductor device.

9. The method of claim 2, being used in a process of forming a film for a semiconductor device.

10. The method of claim 3, being used in a process of forming a film for a semiconductor device.

11. The method of claim 4, being used in a process of forming a film for a semiconductor device.

12. The method of claim 5, being used in a process of forming a film for a semiconductor device.

13. The method of claim 6, being used in a process of forming a film for a semiconductor device.

14. The method of claim 7, being used in a process of forming a film for a semiconductor device.

* * * * *